(12) United States Patent
Jung et al.

(10) Patent No.: US 10,855,927 B2
(45) Date of Patent: Dec. 1, 2020

(54) EVENT DETECTING DEVICE INCLUDING AN EVENT SIGNAL GENERATOR AND AN OUTPUT SIGNAL GENERATOR

(71) Applicant: Samsung Electronics Co., Ltd., Suwon-si (KR)

(72) Inventors: Hee Jae Jung, Suwon-si (KR); Jun Seok Kim, Hwaseong-si (KR); Hyun Surk Ryu, Hwaseong-si (KR); Yun Jae Suh, Suwon-si (KR); Bong Ki Son, Hwaseong-si (KR); Seol Namgung, Seoul (KR); Keun Joo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 15/896,807

(22) Filed: Feb. 14, 2018

(65) Prior Publication Data

US 2018/0262665 A1    Sep. 13, 2018

(30) Foreign Application Priority Data

Mar. 8, 2017   (KR) .................. 10-2017-0029687
Nov. 13, 2017  (KR) .................. 10-2017-0150602

(51) Int. Cl.
*H04N 5/235*    (2006.01)
*G06T 7/20*     (2017.01)
(Continued)

(52) U.S. Cl.
CPC ......... *H04N 5/2351* (2013.01); *G06F 3/0656* (2013.01); *G06T 7/20* (2013.01);
(Continued)

(58) Field of Classification Search
CPC .... H04N 5/2351; H04N 5/351; H04N 5/3745; H04N 5/376; H04N 5/341; H04N 5/3741;
(Continued)

(56) References Cited

U.S. PATENT DOCUMENTS 6,253,161 B1   6/2001  Arias-Estrada
6,963,116 B2  11/2005  Kawahito
(Continued)

FOREIGN PATENT DOCUMENTS

JP    2005-295346    10/2005
JP    2010-171666     8/2010
JP    2014-90394      5/2014

OTHER PUBLICATIONS

A 128×128 120dB 15 µs Latency Asynchronous Temporal Contrast Vision Sensor, Lichtsteiner, P., C. Posch and T. Delbruck. IEEE JSSC, Feb. 2008, 43(2) 566-576.
(Continued)

*Primary Examiner* — Khiem D Nguyen
(74) *Attorney, Agent, or Firm* — Myers Bigel, P.A.

(57) ABSTRACT

An event detecting device may include an event signal generator configured to output a plurality of event signals, each including a first data and a second data having mutually complementary attributes and respective address data indicating positions of pixels having output the first data and the second data, a data manager configured to store one of the first data and the second data of a first one of the plurality of event signals and the respective address data in a buffer as first sub data when only one of the first data and the second data of the first one of the plurality of event signals includes the event information, and an output signal generator configured to generate an output signal using the first sub data and a second sub data when the second sub data, different from the first sub data, is stored in the buffer.

20 Claims, 9 Drawing Sheets

(51) Int. Cl.
*H01L 27/146* (2006.01)
*G09G 3/20* (2006.01)
*G06F 3/06* (2006.01)
*H04N 5/3745* (2011.01)
*H04N 5/351* (2011.01)
*H04N 5/376* (2011.01)

(52) U.S. Cl.
CPC ........... *G09G 3/20* (2013.01); *H01L 27/1463* (2013.01); *H04N 5/351* (2013.01); *H04N 5/376* (2013.01); *H04N 5/3745* (2013.01); *G09G 2310/0213* (2013.01); *G09G 2360/142* (2013.01); *G09G 2380/10* (2013.01)

(58) Field of Classification Search
CPC ...... H04N 5/378; H04N 5/3415; H04N 5/374; H04N 5/232; G06T 7/20; H01L 27/1463; H01L 27/14603; H01L 27/14609; G09G 3/20; G09G 2360/142; G09G 2310/0213; G06F 3/0656; G06F 17/30; G06K 7/10851; G06K 7/10722; G06K 9/6202; H05B 39/04
See application file for complete search history.

(56) References Cited

U.S. PATENT DOCUMENTS

| | | | |
|---|---|---|---|
| 7,804,426 B2 | 9/2010 | Etcheson | |
| 8,032,416 B2 | 10/2011 | Concilio et al. | |
| 9,325,922 B2 * | 4/2016 | Ohya | H04N 5/37455 |
| 9,455,295 B2 | 9/2016 | Takeshita et al. | |
| 9,554,100 B2 | 1/2017 | Gousev et al. | |
| 10,373,357 B2 * | 8/2019 | Woo | G06T 11/60 |
| 2007/0107038 A1 | 5/2007 | Aronsson | |
| 2008/0135731 A1 | 6/2008 | Lichtsteiner et al. | |
| 2010/0110221 A1 * | 5/2010 | Morishita | H04N 1/0402 348/222.1 |
| 2010/0201869 A1 * | 8/2010 | Shin | G06T 1/00 348/448 |
| 2011/0216098 A1 * | 9/2011 | Choi | G09G 5/10 345/690 |
| 2013/0329952 A1 | 12/2013 | Lee et al. | |
| 2014/0009648 A1 | 1/2014 | Kim et al. | |
| 2014/0125994 A1 * | 5/2014 | Kim | G01B 11/22 356/601 |
| 2014/0326854 A1 | 11/2014 | Delbruck et al. | |
| 2014/0368712 A1 | 12/2014 | Park et al. | |
| 2015/0069218 A1 | 3/2015 | Cho et al. | |
| 2015/0319341 A1 | 11/2015 | Sekine | |
| 2015/0341585 A1 * | 11/2015 | Jin | H04N 5/3745 348/308 |
| 2015/0365617 A1 | 12/2015 | Chen | |
| 2016/0011654 A1 * | 1/2016 | Lee | G06N 3/063 345/156 |
| 2016/0078001 A1 | 3/2016 | Wang et al. | |
| 2016/0078321 A1 | 3/2016 | Wang et al. | |
| 2016/0093273 A1 | 3/2016 | Wang et al. | |
| 2016/0094768 A1 * | 3/2016 | Ovsiannikov | H04N 5/378 348/372 |
| 2016/0094787 A1 | 3/2016 | Govil et al. | |
| 2016/0203614 A1 | 7/2016 | Wang et al. | |
| 2016/0227135 A1 | 8/2016 | Matolin et al. | |
| 2016/0274643 A1 * | 9/2016 | Liu | G06F 1/3215 |
| 2017/0034466 A1 | 2/2017 | Numata | |
| 2017/0053407 A1 | 2/2017 | Benosman et al. | |
| 2017/0059399 A1 * | 3/2017 | Suh | G01J 1/42 |
| 2017/0280079 A1 * | 9/2017 | Fu | G06F 1/3234 |
| 2018/0167575 A1 | 6/2018 | Watanabe et al. | |
| 2019/0052820 A1 | 2/2019 | Berner | |

OTHER PUBLICATIONS

A 640×480 Dynamic Vision Sensor with a 9 μm Pixel and 300Meps Address-Event Representation, B. Son et al., ISSCC, Feb. 2017.

* cited by examiner

EVENT DETECTING DEVICE INCLUDING AN EVENT SIGNAL GENERATOR AND AN OUTPUT SIGNAL GENERATOR

CROSS-REFERENCE TO RELATED APPLICATIONS

This application claims priority under 35 U.S.C. § 119 to Korean Patent Application No. 10-2017-0029687 filed on Mar. 8, 2017 in the Korean Intellectual Property Office, and to Korean Patent Application No. 10-2017-0150602 filed on Nov. 13, 2017 in the Korean Intellectual Property Office, the entire contents of which are hereby incorporated herein by reference in their entirety.

BACKGROUND

Embodiments of the inventive concepts relate to electronic devices, and more particularly, to event detecting devices.

Event detecting devices are devices that are configured to detect the occurrence of events by detecting a visual change, and may be applied to various fields such as autonomous vehicles, artificial intelligence, and the like. When event detecting devices detect a significant change by sensing light, the event detecting devices may convert the detected change into electrical signals and may output the converted signals. The signals output by the event detecting devices may include a change-detected time, change-detected positional information of pixels, and the like. As the fields to which event detection sensors may be applied are increasing, various studies are being undertaken into improving the performance thereof.

SUMMARY

Some embodiments of the inventive concepts may provide event detecting devices including an improved data processing speed and effective compensation for an errors occurring in pixels due to external noise or the like.

According to some embodiments of the inventive concepts, event detecting devices are provided. An event detecting device may include an event signal generator configured to output a plurality of event signals. Each of the event signals may include a first data and a second data having mutually complementary attributes, and respective address data indicating positions of pixels having output the first data and the second data. The event detecting device may include a data manager configured to store one of the first data and the second data of a first one of the plurality of event signals and the respective address data in a buffer as first sub data when only the one of the first data and the second data of the first one of the plurality of event signals includes event information, and to store one of the first data and the second data of a second one of the plurality of event signals and the respective address data in the buffer as second sub data when only the one of the first data and the second data of the second one of the plurality of event signals includes event information. The event detecting device may include an output signal generator configured to generate an output signal using the first sub data and the second sub data when the second sub data is stored in the buffer.

According to some embodiments of the inventive concepts, event detecting devices are provided. An event detecting device may include a pixel array including a plurality of pixels arranged in a plurality of rows and a plurality of columns. The event detecting device may include an event signal generator configured to generate an event signal, by grouping pixel signals output by two or more adjacent pixels among the plurality of pixels into a group. The event signal may include a first data and a second data generated from the pixel signals and having complementary attributes. The event detecting device may include an output signal generator configured to combine at least a first portion of the event signal with at least a second portion of another event signal when only one of the first data and the second data of the event signal includes event information, and to provide the combination as an output signal.

According to some embodiments of the inventive concepts, event detecting devices are provided. An event detecting device may include a pixel array including a plurality of pixels. The event detecting device may include an event signal generator configured to classify the plurality of pixels into a plurality of groups, and to generate a plurality of event signals, based on position information of the pixels included in respective ones of the plurality of groups, and polarities of pixel signals output from the pixels included in the respective ones of the plurality of groups. The event detecting device may include an output signal generator configured to generate an output signal by combining a first event signal corresponding to a first one of the plurality of groups with a second event signal corresponding to a second one of the plurality of groups when polarities of each of the pixel signals generated, by the pixels of the first one of the plurality of groups are equal to each other, and to output the output signal.

BRIEF DESCRIPTION OF DRAWINGS

Embodiments of the inventive concepts will be more clearly understood in view of the detailed description and the accompanying drawings.

DETAILED DESCRIPTION

Some embodiments of the inventive concepts will be described with reference to the accompanying drawings.

Like reference numerals in the drawings may denote like elements, and thus repeated descriptions may be omitted for brevity.

Figure 1:
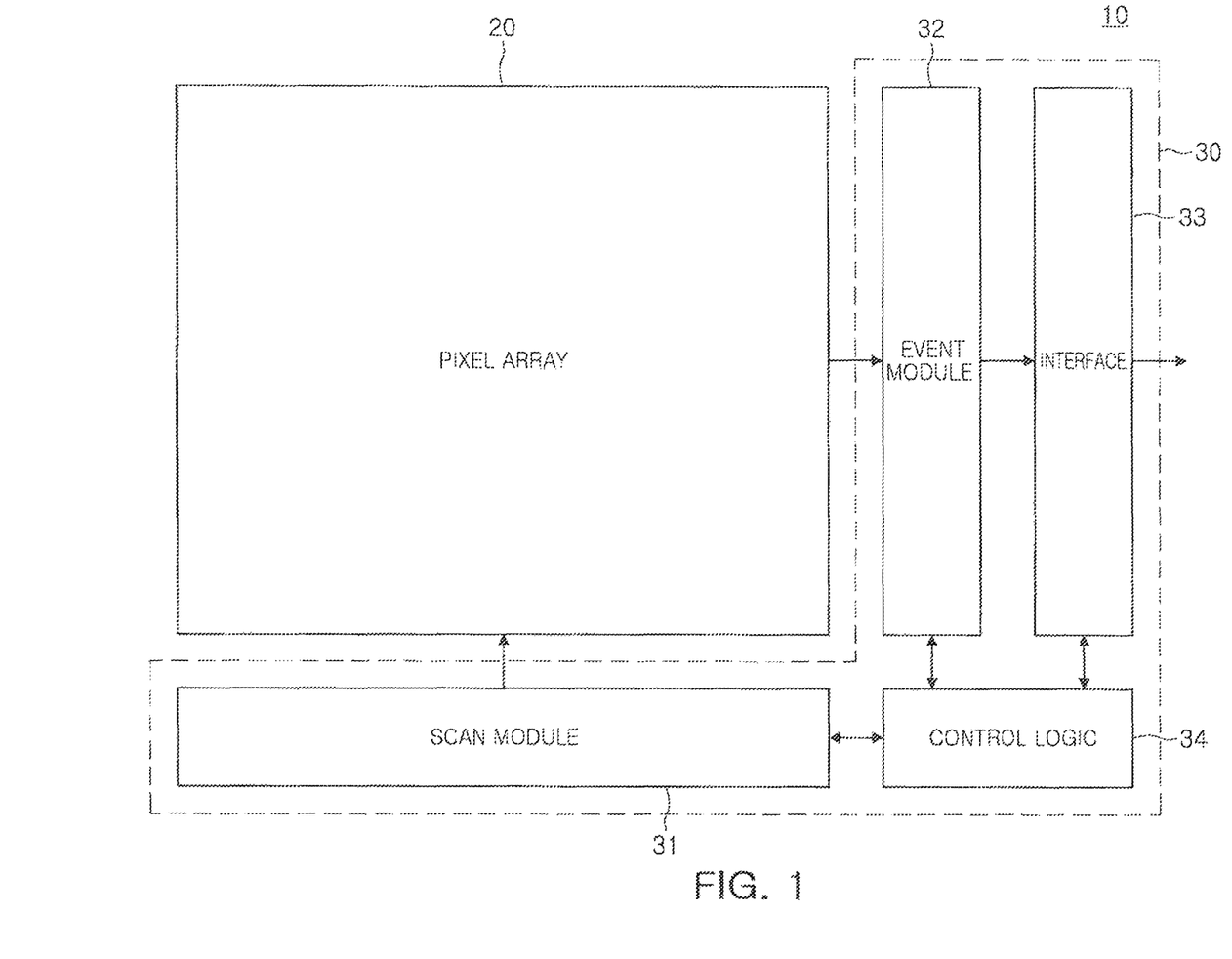
FIG. 1 is a block diagram illustrating an event detecting device according to some embodiments of the inventive concepts.

FIG. 1 is a block diagram illustrating an event detecting device according to some embodiments of the inventive concepts.

Referring to FIG. 1, an event detecting device 10 according to some embodiments may include a pixel array 20 and, a processor 30. The pixel array 20 may generate art electrical signal by sensing an increase or decrease in light, and may include a plurality of pixels arranged in a plurality of rows and columns.

The processor 30 may include a scan module 31, an event module 32, an interface 33, a control logic 34, and the like. The scan module 31 may scan the pixels included in the pixel array 20 in a direction of one of a plurality of rows and columns. For example, the scan module 31 may scan horizontally or vertically. In some embodiments, the scan module 31 may sequentially scan a plurality of column lines.

The event module 32 may generate an output signal including an event detection result, using an electric signal output front the pixels connected to the column lines scanned by the scan module 31. In some embodiments, the event module 32 may generate an event signal including information, regarding a polarity based on an increase or decrease in light, a position of a pixel in which an increase or decrease in light has occurred, a time at which an increase or decrease in light has occurred, and the like, using one or more pixel signals output by the pixels.

The interface 33 may communicate with external devices. In some embodiments, the interface 33 may exchange data with an application processor or the like according to a mobile industry processor interface (MIDI) protocol. The control logic 34 may control operations of the scan module 31, the event module 32, and/or the interface 33.

The event signal may include a first data and a second data having complementary properties and indicating polarities of events generated in respective pixels, address data indicating a location of a pixel in which an event occurs, and the like. In some embodiments, for example, when both the first data and the second data include event information, the processor 30 may transmit an event signal to the interface 33 as it is. On the other hand, when only one of the first data and the second data includes event information, the processor 30 may temporarily store the event information in a buffer, and may combine the event information with event information included in event signals generated thereafter, to output an output signal. For example, when an event signal is generated by pixel signals having one polarity, the event signal may be combined with another event signal generated later, and then, may output the combined signal as an output signal. Thus, a data processing speed may be increased, and a transmission amount of an output signal may be reduced.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

Figure 2:
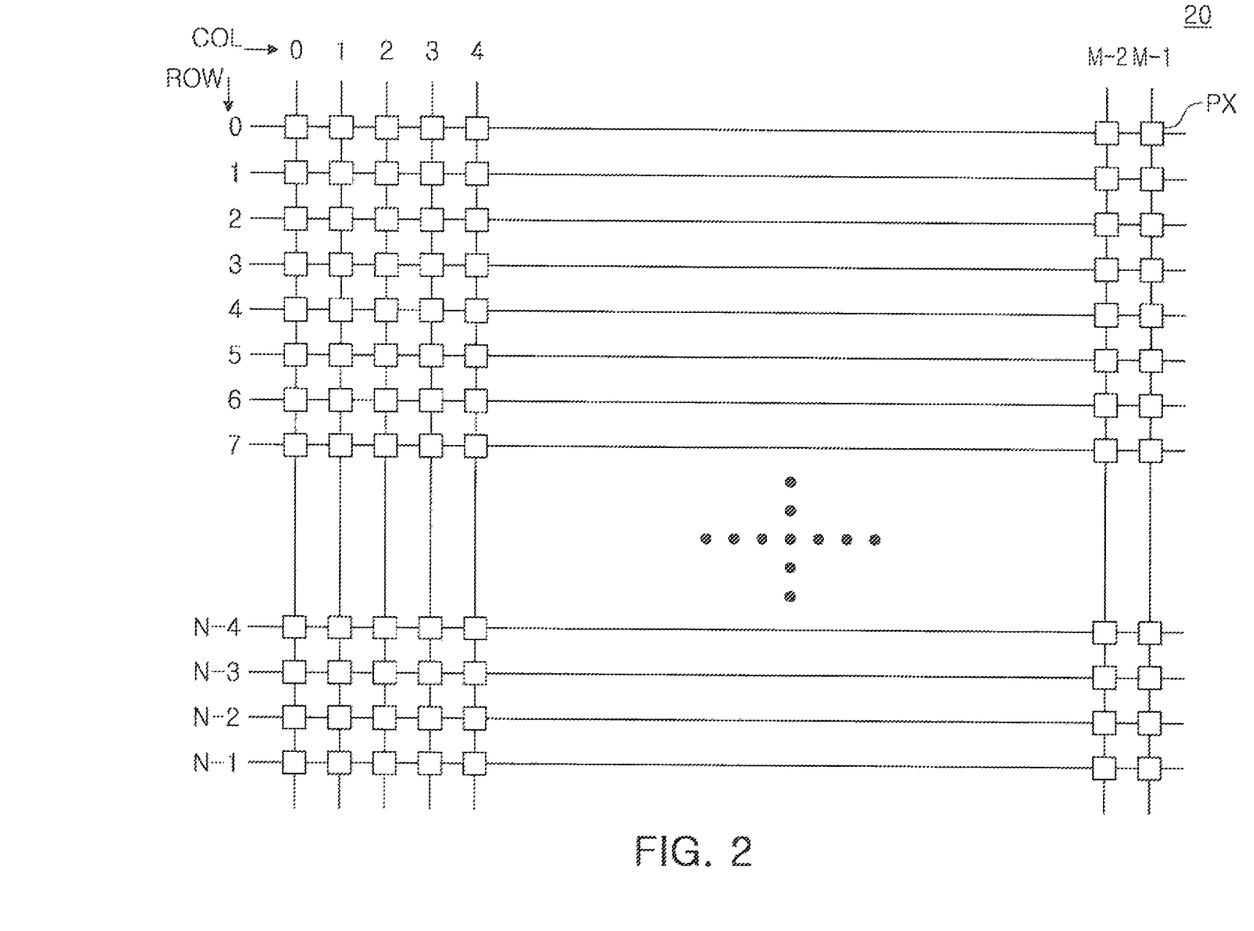
FIG. 2 is a block diagram illustrating a pixel array included in are event detecting device according to some embodiments of the inventive concepts.

FIG. 2 is a block diagram illustrating a pixel array included in an event detecting device according to some embodiments of the inventive concepts.

Referring to FIG. 2, the pixel array 20 according to some embodiments may include a plurality of pixels PX arranged in a plurality of row lines ROW and column lines COL. In some embodiments, the pixel array 20 may include N row lines ROW and M column lines COL. Thus, the pixel array 20 may include a total of M×N pixels PX.

The plurality of pixels PX included in the pixel array 20 may be scanned in a row line (ROW) or column line (COL) unit. In some embodiments, a pixel signal may be detected from the pixels PX while sequentially scanning the plurality of column lines COL, and an event signal may be generated using the pixel signal. The event signal may include information, such as a type of an event corresponding to an increase or a decrease in light, a position of a pixel in which an event has occurred, a timestamp value corresponding to an event occurrence time, and the like.

Figure 3:
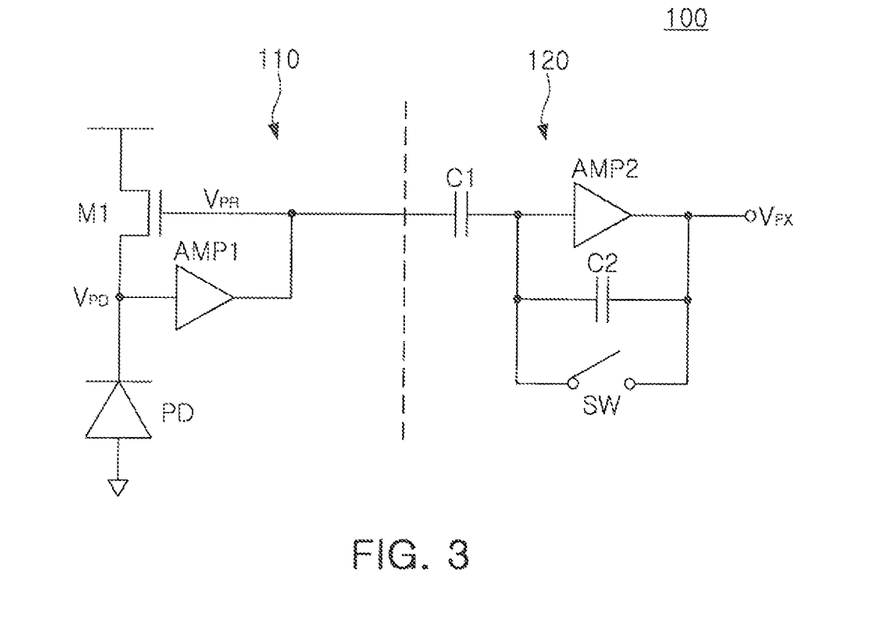
FIG. 3 is a circuit diagram illustrating a pixel circuit included in an event detecting device according to some embodiments of the inventive concepts.

FIG. 3 is a circuit diagram illustrating a pixel circuit included in an event detecting device according to some embodiments of the inventive concepts.

Referring to FIG. 3, a pixel circuit 100 of an event detecting device according to some embodiments may correspond to a pixel PX of the pixel array 20. The pixel circuit 100 may include a first circuit 110 and a second circuit 120. In some embodiments, the first circuit 110 may convert a charge generated in a photodiode PD provided for each pixel, into a first voltage $V_{PR}$, and may output the converted voltage.

For example, when a charge is generated in the photodiode PD according to a change in light, a first amplifier AMP1 may amplify a voltage $V_{PD}$ based on the charge of the photodiode PD. As an example, the first amplifier AMP1 may amplify the voltage $V_{PD}$ of the photodiode PD by a logarithmic scale, and thus, a magnitude of the first voltage $V_{PR}$ may be linearly proportional to an intensity of light sensed by the photodiode PD.

The second circuit 120 may generate a pixel voltage $V_{PX}$ indicating an amount of change in light using the first voltage $V_{PR}$. The second circuit 120 may include a first capacitor C1, a second capacitor C2, a switch SW, and a second amplifier AMP2.

The first capacitor C1 may be connected between an output terminal of the first amplifier AMP1 and an input terminal of the second amplifier AMP2, and may be charged with a charge depending on a change in the first voltage $V_{PR}$. The second amplifier AMP2 may generate the pixel voltage $V_{PX}$ by amplifying a voltage of the first capacitor C1 according to a ratio of capacitance values of the first capacitor C1 and the second capacitor C2. The switch SW may reset the charge charged in the first capacitor C1.

In some embodiments, the pixel circuit may include one or more circuits different from the first circuit 110 and second circuit 120 of FIG. 3 in order to measure an amount of change in light and/or to generate the pixel voltage $V_{PX}$ indicating the amount of change in light.

The event detecting device according to some embodiments may generate an event signal using the pixel voltage $V_{PX}$. In an example, the event signal may include information, regarding a position of a pixel having output the pixel voltage $V_{PX}$ corresponding to an increase or decrease in light, time at which the pixel has output the pixel voltage $V_{PX}$, and a type of art event corresponding to an increase or decrease in light estimated from the pixel voltage $V_{PX}$, and the like.

The event signal may be encoded in a predetermined format, and in some embodiments, the event signal may include a first data and a second data having complementary properties to each other. For example, an event signal may be output including both a first data and a second data regardless of event information included in each of the first data and the second data. Accordingly, when the event information is only included in the first data, since both the first data and the second data are output, an amount of transmission of data may be unnecessarily increased.

Thus, according to some embodiments of the inventive concepts, for example, when only one of the first data and the second data has event information using complementary attributes of the first data and the second data, event information may be combined with event information of another event signal to be output. Thus, a transmission amount of an output signal may be reduced, and a data processing speed may be increased.

Figure 4:
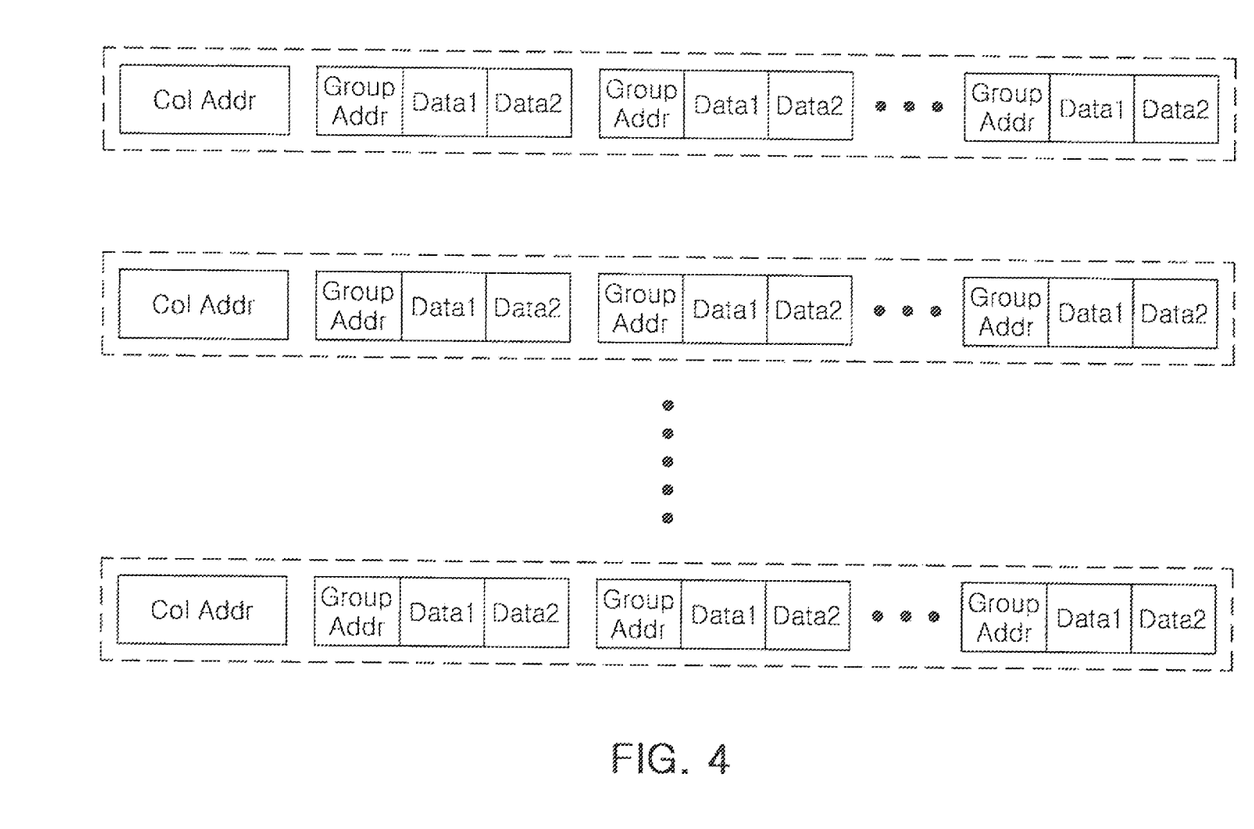
FIGS. 4 and 5 are block diagrams illustrating event signals generated in an event detecting device according to some embodiments of the inventive concepts.
Figure 5:
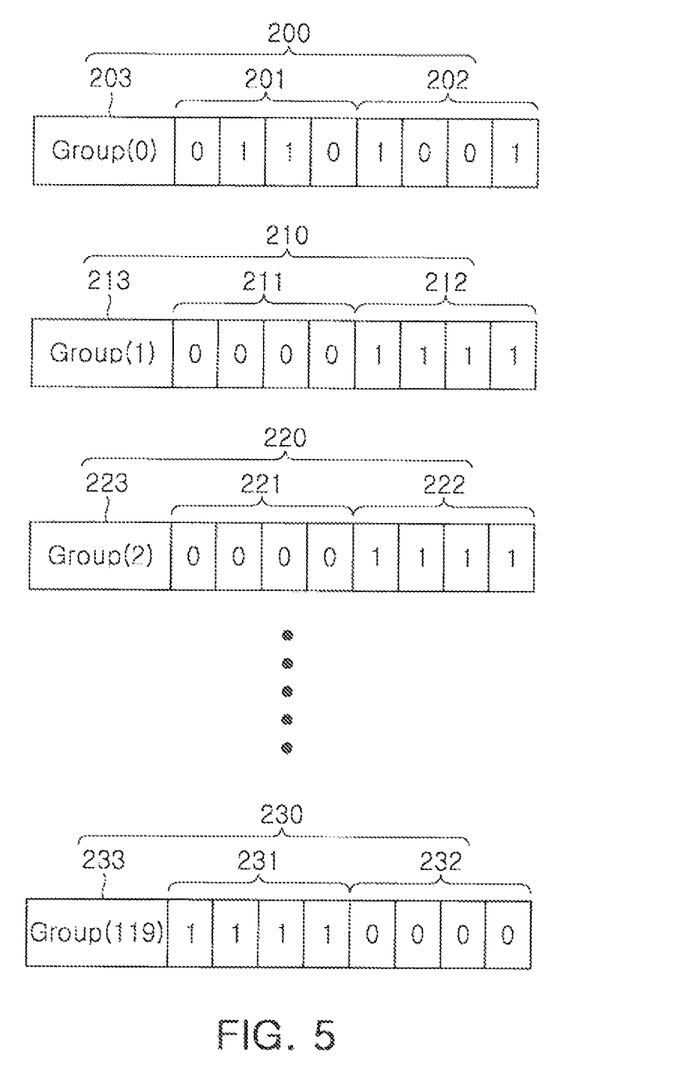

FIGS. 4 and 5 are block diagrams illustrating event signals generated in an event detecting device according to some embodiments of the inventive concepts.

In an event detecting device according to some embodiments, two or more pixels, adjacent to each other, may be defined as one pixel group, and data generated in pixels included in each pixel group may be output in a single data format. For example, when a pixel array of the event detecting device includes M column lines and includes N row lines, event signals may be output in an order in which the M column lines are scanned. In addition, a group of pixels may be defined by grouping adjacent pixels among N pixels connected to each of the M column lines, for example, grouping adjacent portions of the N pixels connected to each of the M column lines. The number of pixels included in each of the pixel groups may be a divisor of N. As an example, when the number of pixels connected to each of the M column lines is 480, the pixel group may include four or eight pixels connected to a single column line and adjacent to one another.

On the other hand, in some embodiments, event signals generated by the event detecting device may be output in the order of scanning the M column lines. Referring to FIG. 4, an event signal may include column address data Col Addr indicating a position of a column line, and event data generated by pixels connected to each of the column lines.

Respective event data may include a first data Data1 and a second data Data2 having mutually complementary attributes. The first data Data1 and the second data Data2 may each have a plurality of bits, and the number or bits included in each of the first data Data1 and the second data Data2 may be the same as the number of pixels included in one pixel group. For example, when the pixel group is connected to one column region and includes four pixels adjacent to one another, each of the first data Data1 and the second data Data2 may have four bits. On the other hand, for example, when the pixel group is connected to one column region and includes eight pixels adjacent to one another, each of the first data Data1 and the second data Data2 may have eight bits.

Each of the event data may include group address data Group Addr indicating a position of a pixel group having output the first data Data1 and the second data Data2. It may be determined in which position of a pixel array the first data Data1 and the second data Data2 have respectively been generated, using the group address data Group Addr, and column address data Col Addr included in the event signal.

For example, a pixel array may include pixels arranged in a 640×480 array, and one pixel group may include four pixels adjacent to one another on a column line. In this case, when the column address data Col Addr is 0 and the group address data Group Addr is also 0, four bits included in each of the first data Data1 and the second data Data2 may be determined as having been generated from pixels positioned at coordinates (0,0), (0,1), (0,2) and (0,3).

FIG. 5 illustrates event signals generated from 480 pixels connected to one column line. In FIG. 5, the 480 pixels in one column line may be divided into 120 pixel groups. For example, one pixel group may include four pixels adjacent to each other.

A first event signal 200 may correspond to a first pixel group Group(0), and may include a first data 201, a second data 202, and a group address data 203. The first data 201 and the second data 202 may have mutually complementary properties, and may correspond to data respectively generated from first to fourth pixels among the 480 pixels. The group address data 203 may indicate a pixel group having generated the first event signal 200, and may have a value indicating the first pixel group Group(0).

A second event signal 210, and a third event signal 220 to a 120th event signal 230, may also be generated in the same manner as the first event signal 200. In FIG. 5, since group address data 203, 213, 223 and 233 may have values ranging from 0 to 119, the group address data 203, 213, 223 and 233 may include at least seven bits.

Referring to FIG. 5, both the first data 201 and the second data 202 included in the first event signal 200 may include event information, while in die second event signal 210 and the third event signal 220, only a second data 212 and 222 may include event information. In the 120th event signal 230, only the first data 231 may include event information. Thus, if the second event signal 210, the third event signal 220, and the 120th event signal 230 are transmitted to an application processor or the like as it is, waste of data transfer amount may occur, and unnecessary power consumption may be increased.

When there is a lot of movement of an object that is in view of the pixel array 20 of the event detecting device 10, a probability that only one of the first data 201, 211, 221 or 231 and the second data 202, 212, 222 or 232 may include event information may be high. In some embodiments of the inventive concepts, for example, when only one of the first data 201, 211, 221 or 231 and the second data 202, 212, 222 or 232 includes event information by analyzing the event signals 200, 210, 220 and 230, relevant event information may be combined with another event information to be output as one output signal. For example, in FIG. 5, pieces of event information included in the second event signal 210 and the third event signal 220 may be combined into one output signal, and may be transmitted to an application processor or the like. The output signal may include the second data 212 of the second event signal 210, the second data 222 of the third event signal 220, and pieces of group address data 213 and 223 of the respective second and third event signals 210 and 220. Thus, the data transfer amount may be efficiently operated, and further, power consumption of the event detecting device may be reduced.

Figure 6:
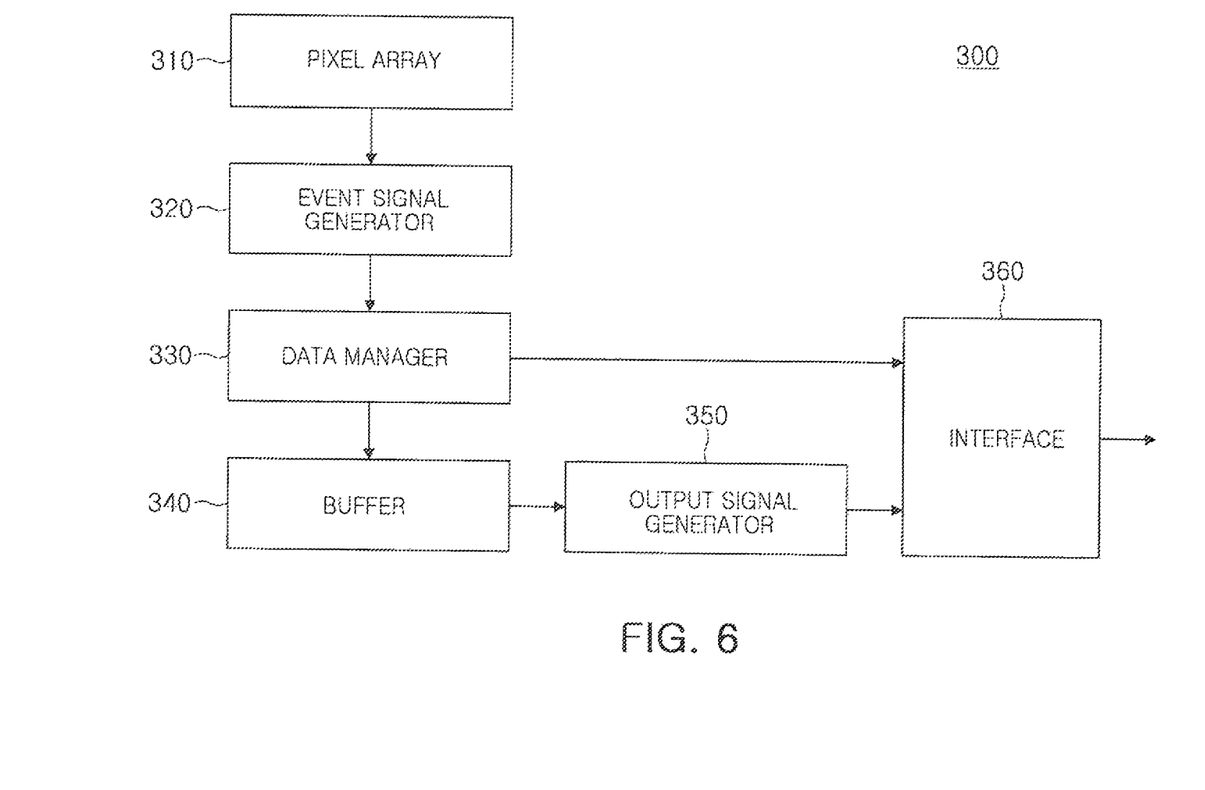
FIG. 6 is a block diagram illustrating an event detecting device according to some embodiments of the inventive concepts.

FIG. 6 is a block diagram illustrating an event detecting device according to some embodiments of the inventive concepts.

With reference to FIG. 6, an event detecting device 300 according to some embodiments may include a pixel array 310, an event signal generator 320, a data manager 330, a buffer 340, an output signal generator 350, an interface 360, and the like. The pixel array 310 of the event detecting device 300 may be similar to the pixel array 20 of the event detecting device 10. For example, the pixel array 310 may include a plurality of pixels arranged in a plurality of row lines and column lines, and each pixel may output a pixel signal by sensing an increase or decrease in light based on movement of an object.

The event signal generator 320 may generate an event signal using pixel signals output from the pixels. The event signal may include an on event signal corresponding to an increase in light sensed by the pixels, and an off-event signal corresponding to a decrease in light sensed by the pixels. In some embodiments, two or more pixels connected to a single column line and adjacent to each other may be represented by one pixel group, and the event signal generator 320 may generate one event signal corresponding to one pixel group. Thus, one event signal may include data generated from two or more pixels.

The event signal may include a first data, a second data, address data, and the like. The first data and the second data may be data generated by sensing an increase or decrease in light by a plurality of pixels included in the pixel group, and may have mutually complementary properties. The address data may be data representing a position of the pixel group in which the first data and the second data have been generated. The address data may include address information of a column line to which a pixel group belongs, and information indicating which number, among pixel groups in a relevant column line, the pixel group is.

The data manager 330 may determine whether only one of the first data and the second data includes event information or whether both the first data and the second data include event information. For example, when both the first data and the second data include event information, the data manager 330 may transmit an event signal to the interface 360 as it is. The interface 360 may transmit the event signal as an output signal to an external application processor or the like.

In some embodiments, the data manager 330 may perform an AND operation to determine whether only one of the first data and the second data includes event information and which one between the first data and the second data only includes the event information. The data manager 330 may perform an AND operation in which n bits, where n is a natural number of 2 or more, included in one of the first data or the second data, are used as an input, and may determine whether only one of the first data and the second data includes event information by referring to an output thereof.

As an example, when a result of the AND operation using n bits included in the first data is 1, the data manager 330 may determine that the first data includes event information. When the result of the AND operation using the n bits included in the second data is 1, the data manager 330 may determine that the second data includes the event information.

When only one of the first data and the second data includes event information, the data manager 330 may store the event information in the buffer 340 as first sub data. The buffer 340 may store address data together with the event information, as the first sub data.

Then, the data manager 330 may receive subsequent event signals, and may determine whether only one of a first data and a second data in each of the subsequent event signals includes event information. For example, when only one of the first data and the second data in the subsequent event signals includes event information, the data manager 330 may store event information relevant thereto in the buffer 340 as second sub data.

Figure 7:
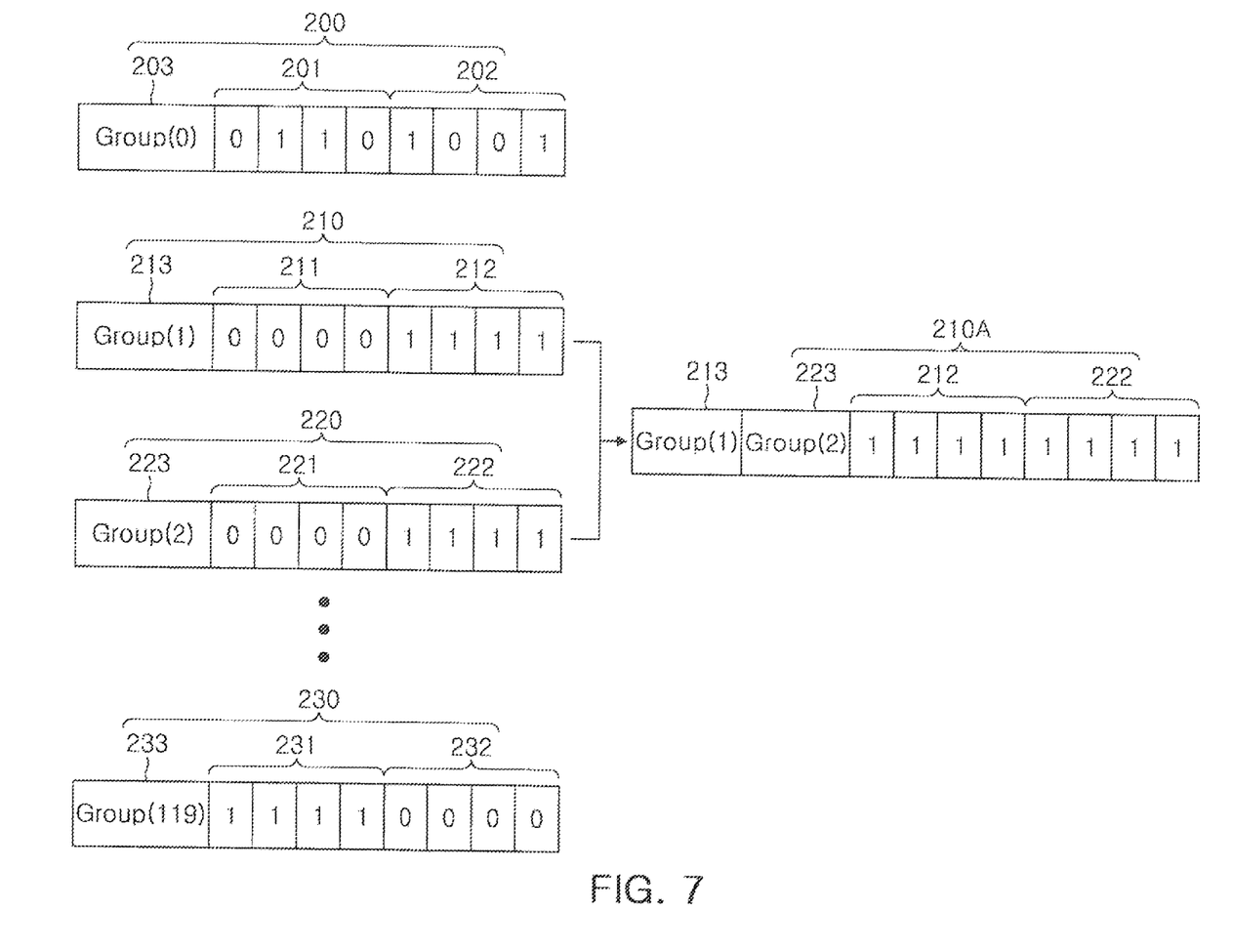
FIG. 7 is a block diagram illustrating an output signal generated by an event detecting device according to some embodiments of the inventive concepts.

When the first sub data and the second sub data are stored in the buffer 340, the output signal generator 350 may generate an output signal by fetching the first sub data and the second sub data stored in the buffer 340. The output signal generator 350 may generate the output signal using the address data and the event information respectively included in the first sub data and the second sub data. Thus, the output signal generated by the output signal generator 350 may include more information than that included in the event signal output by the event signal generator 320. The interface 360 may transmit the output signal generated by the output signal generator 350 to an external application processor or the like. A method of generating an output signal by the event detecting device 300 will be described in more detail with reference to FIG. 7, FIG. 7 is a block diagram illustrating an output signal generated by an event detecting device according to some embodiments of the inventive concepts. Referring to FIG. 7, a first event signal 200 may include a first data 201 and a second data 202, including event information generated by sensing an increase or a decrease in light in pixels included in a pixel group, and group address data 203 indicating a position of the pixel group. The first data 201 and the second data 202 may complementary attributes.

The first data 201 and the second data 202 included in the first event signal 200 may both include event information. Thus, the data manager 330 may transmit the first event signal 200 to the interface 360 as it is, and the interface 360 may output the first event signal 200 as an output signal.

In a second event signal 210, different from the first event signal 200, only a second data 212 may include event information, and a first data 211 may not include event information. The data manager 330 may extract the second data 212 including the event information and group address data 213 of the second event signal 210, from the second event signal 210, and may allow the extracted data to be stored as first sub data in the buffer 340.

In a third event signal 220 output by the event signal generator 320 subsequently to the second event signal 210, only a second data 222 may include event information in. The data manager 330 may store the second data 222 and a group address data 223 of the third event signal 220 in the buffer 340 as second sub data.

When the first sub data and the second sub data are stored in the buffer 340, the output signal generator 350 may generate an output signal 210A using the first sub data and the second sub data. The output signal 210A may include the group address data 213 and the second data 212 included in the second event signal 210, and the group address data 223 and the second data 222 included in the third event signal 220. Thus, the output signal 210A may include more information than included in the event signals 200, 210, 220 and 230. On the other hand, in some embodiments, even when the first event signal 200 is output as it is, null data having a plurality of bits may be added to the first event signal 200, such that the first event signal 200 may have the same data length as the output signal 210A.

Figure 8:
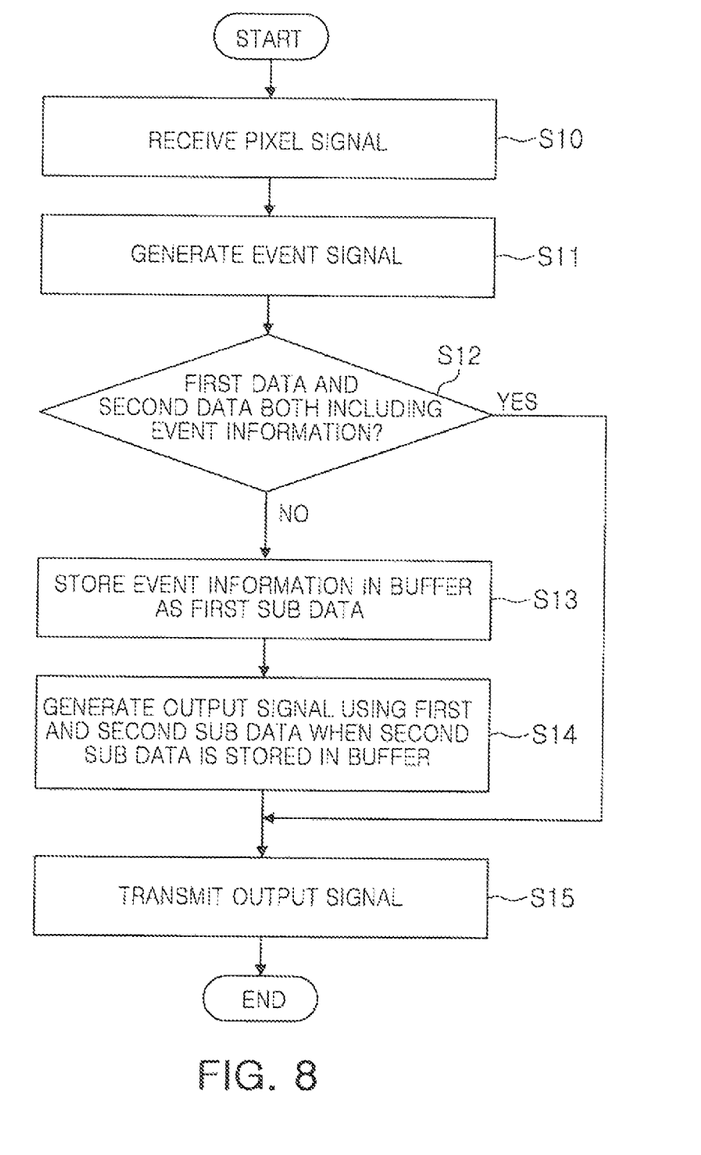
FIG. 8 is a flowchart illustrating operations of an event detecting device according to some embodiments of the inventive concepts.

FIG. 8 is a flowchart illustrating operations of an event detecting device according to some embodiments of the inventive concepts.

Referring to FIG. 8, an operation of an event detecting device according to some embodiments may begin in operation S10 with receiving pixel signals output from respective pixels included in a pixel array. A pixel signal may be an electrical signal generated in each of the pixels in response to an increase or decrease in brightness of light caused by movement of an object.

In an operation S11, the event detecting device may generate an event signal using a pixel signal. The event signal may include a first data and a second data having event information corresponding to an increase or a decrease in brightness of light, sensed by the pixels, address data indicating positions of the pixels having output the pixel signal, and the like. In some embodiments, the event signal may also include timestamp values corresponding to times at which the pixels have sensed an increase or decrease in brightness of light. The first data and the second data may include event information corresponding to an increase or a decrease in brightness of light sensed by the pixels included in one pixel group.

In an operation S12, the event detecting device may analyze the event signal generated in operation S11 to determine whether both the first data and the second data include event information. As a result of the determination in operation S12, when it is determined that both the first data and the second data include event information, the event detecting device may, in an operation S15, transmit the event signal having been generated in operation S11 to an external processor or the like, as an output signal.

On the other hand, when it is determined in operation S12 that only one of the first data and the second data includes event information, the event detecting device may, in an operation S13, store the event information in a buffer as first sub data. The first sub data may further include address data indicating positions of the pixels having generated the event information, in addition to the event information.

Then, when second sub data is further stored in the buffer, the event detecting device may, in an operation S14, generate an output signal using the first sub data and the second sub data. Similarly to the first sub data, the second sub data may include address data and event information extracted from an event signal in which only one of the first data or the second data includes event information. The output signal generated by the event detecting device in operation S14 may include event information generated in different pixel groups, address data indicating positions of the different pixel groups, and the like. In the operation S15, the event detecting device may transmit the output signal generated in operation S14 to an external processor or the like.

Figure 9:
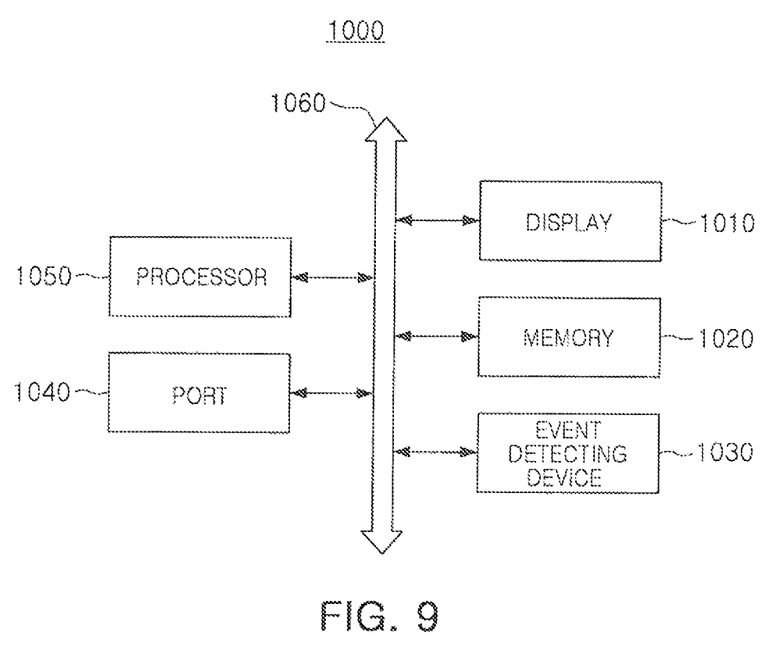
FIG. 9 is a block diagram illustrating an electronic device including an event detecting device according to some embodiments of the inventive concepts.

FIG. 9 is a block diagram illustrating an electronic device including an event detecting device according to some embodiments of the inventive concepts.

Referring to FIG. 9, an electronic device 1000 according to some embodiments may include a display 1010, a memory 1020, an event detecting device 1030, a port 1040, a processor 1050, and the like. Constituent elements, such as the display 1010, the memory 1020, the event detecting device 1030, the port 1040, the processor 1050 and the like, may communicate with each other via a bus 1060. The electronic device 1000 may further include a wired/wireless communications device, a power supply device, and the like, in addition to the constituent elements above.

The processor 1050 may perform specific arithmetic operations, commands, tasks, and the like. The processor 1050 may be a central processing unit (CPU), a microprocessor unit (MCU), an application processor (AP), or the like, and may communicate with constituent elements such as the display 1010, the memory 1020, the event detecting device 1030, the port 1040, and the like, via the bus 1060.

The electronic device 1000 may sense an increase or a decrease in brightness of light due to a user's gesture, movement, or the like, as an event, using the event detecting device 1030. The event detecting device 1030 may be provided according to one or more of the embodiments described above with reference to FIGS. 1 to 8, and the like.

As set forth above, in the case of an event detecting device according to some embodiments of the inventive concepts, for example, when only one of a first data and a second data having complementary attributes, included in an event signal, includes event information, the event information may be combined with data of other event signals to be processed. Thus, a data processing speed may be improved. In addition, an event may be accurately detected by correcting errors due to noise, hot pixels, dead pixels, and the like, using correlation of timestamp values generated in respective pixels.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While example embodiments have been shown and described above, it will be apparent to those skilled in the art that modifications and variations could be made without departing from the scope of the present invention as defined by the appended claims.

What is claimed is:

1. An event detecting device comprising:
an event signal generator configured to output a first event signal and a second event signal, each of the first and second event signals comprising a first data and a second data having mutually complementary attributes and respective address data indicating positions of pixels having output the first data and the second data;
a data manager configured to store one of the first data and the second data of the first event signal and the respective address data in a buffer as a first sub data when only the one of the first data and the second data of the first event signal includes event information, and to store one of the first data and the second data of the second event signal and the respective address data in the buffer as a second sub data when only the one of the first data and the second data of the second event signal includes event information; and
an output signal generator configured to generate an output signal comprising a combination of the first sub data and the second sub data when the second sub data is stored in the buffer.

2. The event detecting device of claim 1, wherein the output signal comprises a first address data indicating positions of pixels having output the first sub data, and a second address data indicating positions of pixels having output the second sub data.

3. The event detecting device of claim 1, wherein each of the first data and the second data comprises n bits, where n is an integer number of 2 or more.

4. The event detecting device of claim 3, wherein the data manager is configured to store the second data of the first event signal in the buffer as the first sub data, when the n bits included in the first data of the first event signal are all 0s.

5. The event detecting device of claim 4, wherein the data manager is configured to store the first data of the first event signal in the buffer as the first sub data, when the n bits included in the second data of the first event signal are all 0s.

6. The event detecting device of claim 3, wherein the data manager comprises a logical operation circuit configured to perform a logical AND operation of the n bits included in at least one of the first data and the second data.

7. The event detecting device of claim 3, wherein the n bits included in each of the first data and the second data correspond to events detected by n pixels that are adjacent to each other.

8. The event detecting device of claim 7, wherein the n pixels are arranged in a single direction in a pixel array.

9. The event detecting device of claim 1, wherein the address data of the second sub data indicates positions of pixels that are different from pixels indicated by the address data of the first sub data.

10. The event detecting device of claim 1, further comprising an interface configured to output the output signal to a device external to the event detecting device.

11. The event detecting device of claim 10, wherein the data manager is configured to transmit the first event signal to the interface, as the output signal, when the first data and the second data of the first event signal both include event information.

12. An event detecting device comprising:
a pixel array including a plurality of pixels arranged in a plurality of rows and a plurality of columns;
an event signal generator configured to generate a first event signal, by grouping pixel signals output by two or more adjacent pixels among the plurality of pixels into a group, wherein the first event signal includes a first data and a second data generated from the pixel signals and having mutually complementary attributes; and
an output signal generator configured to generate an output signal comprising a combination of at least a first portion of the first event signal with at least a second portion of a second event signal when only one of the first data and the second data of the event signal includes event information.

13. The event detecting device of claim 12, wherein the two or more adjacent pixels are arranged in one of the plurality of columns.

14. The event detecting device of claim 12, wherein the first event signal comprises address data indicating positions of the two or more adjacent pixels that output the pixel signals.

15. The event detecting device of claim 14, wherein the address data comprises information indicating the group to which the two or more adjacent pixels that output the pixel signals belong.

16. The event detecting device of claim 12, wherein the two or more adjacent pixels are n pixels adjacent to each other, and each of the first data and the second data comprises at least n bits, where n is an integer number of 2 or more.

17. The event detecting device of claim 12, wherein the event signal has a data length equal to a data length of the output signal.

18. An event detecting device comprising:
a pixel array including a plurality of pixels;
an event signal generator configured to classify the plurality of pixels into a plurality of groups, and to generate a plurality of event signals, based on position information of the plurality of pixels included in respective ones of the plurality of groups, and polarities of pixel signals output from the plurality of pixels included in the respective ones of the plurality of groups; and
an output signal generator configured to generate an output signal by combining a first event signal corresponding to a first one of the plurality of groups with a second event signal corresponding to a second one of the plurality of groups when polarities of each of the pixel signals generated by the plurality of pixels of the first one of the plurality of groups are equal to each other, and to output the output signal.

19. The event detecting device of claim 18, wherein the plurality of pixels are configured to output the pixel signals with polarities that are determined based on whether an intensity of light sensed by the respective pixels increase or decrease.

20. The event detecting device of claim 18, wherein each of the plurality of groups comprises two or more pixels continuously arranged in a single direction in the pixel array.

* * * * *